(12) United States Patent
Asagi et al.

(10) Patent No.: US 11,128,043 B2
(45) Date of Patent: Sep. 21, 2021

(54) LIQUID CRYSTAL CELL AND SCANNING ANTENNA

(71) Applicant: SHARP KABUSHIKI KAISHA, Sakai (JP)

(72) Inventors: Hiroaki Asagi, Sakai (JP); Isamu Miyake, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 339 days.

(21) Appl. No.: 16/246,835

(22) Filed: Jan. 14, 2019

(65) Prior Publication Data
US 2019/0221933 A1 Jul. 18, 2019

(30) Foreign Application Priority Data

Jan. 16, 2018 (JP) .............................. JP2018-004984

(51) Int. Cl.
*H01Q 3/44* (2006.01)
*H01Q 21/06* (2006.01)
(Continued)

(52) U.S. Cl.
CPC ........... *H01Q 3/44* (2013.01); *H01L 27/1255* (2013.01); *H01Q 1/44* (2013.01); *H01Q 13/106* (2013.01);
(Continued)

(58) Field of Classification Search
CPC ............ H01Q 1/24; H01Q 1/364; H01Q 1/38; H01Q 1/44; H01Q 13/106; H01Q 13/22; H01Q 15/14; H01Q 19/104; H01Q 21/00; H01Q 21/0012; H01Q 21/005; H01Q 21/0087; H01Q 21/06; H01Q 21/064; H01Q 21/065; H01Q 21/20; H01Q 23/00;
(Continued)

(56) References Cited

U.S. PATENT DOCUMENTS 5,465,169 A * 11/1995 Eguchi .............. G02F 1/133711
349/124
2004/0041969 A1* 3/2004 Tahon ............... G02F 1/133784
349/123
(Continued)

FOREIGN PATENT DOCUMENTS

CN 106374170 A 2/2017
JP 2009-538565 A 11/2009
(Continued)

*Primary Examiner* — Seokjin Kim
(74) *Attorney, Agent, or Firm* — ScienBiziP, P.C.

(57) ABSTRACT

A liquid crystal cell including multiple antenna units includes a TFT board that includes a first dielectric substrate, TFTs on the first dielectric substrate, and patch electrodes electrically connected to the TFTs, a slot board that includes a second dielectric substrate and a slot electrode having slots on the second dielectric substrate, a conductive alignment film having conductivity on at least one of the patch electrodes and the slot electrode, and a liquid crystal layer disposed between the TFT board and the slot board with the patch electrodes and the slot electrode facing each other. The liquid crystal layer includes liquid crystal molecules that are horizontally aligned with respect to the TFT board and the slot board while no voltage is being applied across the patch electrodes and the slot electrode.

13 Claims, 9 Drawing Sheets

(51) Int. Cl.
   *H01Q 13/10* (2006.01)
   *H01Q 1/44* (2006.01)
   *H01L 27/12* (2006.01)
   *H01Q 3/34* (2006.01)
   *H01L 27/13* (2006.01)

(52) U.S. Cl.
   CPC ....... *H01Q 21/064* (2013.01); *H01L 27/1214* (2013.01); *H01L 27/13* (2013.01); *H01Q 3/34* (2013.01)

(58) Field of Classification Search
   CPC .......... H01Q 3/2676; H01Q 3/34; H01Q 3/36; H01Q 3/38; H01Q 3/44; H01Q 9/0457
   See application file for complete search history.

(56) References Cited

U.S. PATENT DOCUMENTS

| | | |
|---|---|---|
| 2007/0273599 A1 | 11/2007 | Haziza |
| 2008/0036664 A1 | 2/2008 | Haziza |
| 2008/0048922 A1 | 2/2008 | Haziza |
| 2008/0111755 A1 | 5/2008 | Haziza |
| 2008/0117113 A1 | 5/2008 | Haziza |
| 2008/0117114 A1 | 5/2008 | Haziza |
| 2009/0058747 A1 | 3/2009 | Haziza |
| 2009/0091500 A1 | 4/2009 | Haziza |
| 2012/0194399 A1 | 8/2012 | Bily et al. |
| 2014/0266946 A1 | 9/2014 | Bily et al. |
| 2015/0229028 A1 | 8/2015 | Bily et al. |
| 2015/0236412 A1 | 8/2015 | Bily et al. |
| 2015/0236415 A1 | 8/2015 | Bily et al. |
| 2016/0359234 A1 | 12/2016 | Bily et al. |
| 2016/0372834 A1 | 12/2016 | Bily et al. |
| 2018/0166780 A1 | 6/2018 | Bily et al. |
| 2018/0186936 A1* | 7/2018 | Ju ...................... C08G 73/1042 |
| 2019/0235291 A1* | 8/2019 | Miyake ................. H01Q 13/22 |
| 2019/0243174 A1* | 8/2019 | Ishii .................... G02F 1/13306 |
| 2020/0115387 A1* | 4/2020 | Mitchell ............. C07D 495/22 |
| 2020/0271975 A1* | 8/2020 | Park ..................... G02F 1/13378 |
| 2020/0286923 A1* | 9/2020 | Kashishita ............ C08L 101/12 |

FOREIGN PATENT DOCUMENTS

| | | |
|---|---|---|
| JP | 2013-539949 A | 10/2013 |
| JP | 2016-512408 A | 4/2016 |
| WO | 2015/126550 A1 | 8/2015 |
| WO | 2017/208996 A1 | 12/2017 |

* cited by examiner

LIQUID CRYSTAL CELL AND SCANNING ANTENNA

CROSS REFERENCE TO RELATED APPLICATION

This application claims priority from Japanese Patent Application No. 2018-004984 filed on Jan. 16, 2018. The entire contents of the priority application are incorporated herein by reference.

TECHNICAL FIELD

The present invention relates to a liquid crystal cell and a scanning antenna.

BACKGROUND

Antennas used for mobile communication and satellite broadcasting, for example, are required to have a beam-steerable beam scanning function. As examples of the antenna having such a function, scanning antennas that use high dielectric anisotropy (birefringence) of liquid crystals (including nematic liquid crystals and polymer-dispersed liquid crystals) are described in Japanese Unexamined Patent Application Publication (Translation of PCT Application) Nos. 2013-539949, 2016-512408, and 2009-538565 and International Publication No. 2015/126550.

This type of scanning antenna includes two boards having electrodes and a liquid crystal layer sandwiched therebetween (i.e., a liquid crystal cell for a scanning antenna). A protection film formed of a nitride film, for example, and an alignment film formed of a polyimide film, for example, are disposed on each of the electrodes of the liquid crystal cell.

The scanning antenna including the liquid crystal cell controls the directivity by using a characteristic that a capacitance of the liquid crystal layer changes (variability) according to application of a voltage across the electrodes.

In one antenna unit (antenna element) of the scanning antenna, a first alignment film, a liquid crystal layer, and a second alignment film are laminated in this order. The combined capacitance C of the first alignment film, the liquid crystal layer, and the second alignment film is simply represented by $1/C=1/Cpia+1/Clc+1/Cpib$, in which Cpia is the capacitance of the first alignment film, Clc is the capacitance of the liquid crystal layer, and Cpib is the capacitance of the second alignment film.

SUMMARY

An antenna gain of the scanning antenna ideally corresponds to a capacitance ON/OFF ratio, which is a ratio between a capacitance during voltage application (ON) Clc_on and a capacitance during no voltage application (OFF) Clc_off. However, since the electrode has the insulating protection film and the alignment film thereon, the value of Con/Coff of the combined capacitance of the antenna unit is inevitably smaller than the value of Clc_on/Clc_off.

An alignment film having a high dielectric constant may be used such that "1/Cpia" and "1/Cpib" are close to zero. However, this is not practical, because the relative permittivity of every film needs to be a few tens to hundreds to obtain the antenna gain inherent in the liquid crystal layer.

An object of the technology described herein is to provide a liquid crystal cell for a scanning antenna that has a highly variable capacitance and to provide a scanning antenna.

A liquid crystal cell according to the technology is a liquid crystal cell including multiple antenna units. The liquid crystal cell includes a TFT board that includes a first dielectric substrate, TFTs on the first dielectric substrate, and patch electrodes electrically connected to the TFTs, a slot board that includes a second dielectric substrate and a slot electrode having slots on the second dielectric substrate, a conductive alignment film having conductivity on at least one of the patch electrodes and the slot electrode, and a liquid crystal layer disposed between the TFT board and the slot board with the patch electrodes and the slot electrode facing each other. The liquid crystal layer includes liquid crystal molecules that are horizontally aligned with respect to the TFT board and the slot board while no voltage is being applied across the patch electrodes and the slot electrode.

A scanning antenna according to the technology includes the liquid crystal cell and a reflective conductive plate facing a surface of the second dielectric substrate away from the liquid crystal layer with a dielectric layer therebetween.

The technology described herein provides a liquid crystal cell for a scanning antenna that has a highly variable capacitance and a scanning antenna.

DETAILED DESCRIPTION

First Embodiment

Basic Structure of Scanning Antenna

A scanning antenna has a beam-steerable beam, scanning function and includes multiple antenna units that use high anisotropy of a dielectric constant M (εM) (birefringence index) of a liquid crystal material. In the scanning antenna, a voltage applied to the liquid crystal layer of each antenna unit is controlled to change the effective dielectric constant M (εM) of the liquid crystal layer of each antenna unit such that a two-dimensional pattern is formed by the antenna units having different capacities. The dielectric constant of the liquid crystal material has frequency dispersion, and the dielectric constant for microwave frequency bands is particularly denoted as a "dielectric constant M(εM)" in the present specification.

Electromagnetic waves (for example, microwaves) emitted from or received by a scanning antenna have different phases corresponding to the capacitances of the antenna units and gain a strong directivity in a particular direction corresponding to the two-dimensional pattern formed by the antenna units having different capacitances (beam scanning). For example, an electromagnetic wave emitted from a scanning antenna is obtained by integrating spherical waves that are obtained through scattering of electromagnetic waves inputted into the antenna units, in consideration of the phase difference provided by the antenna units.

Figure 1:
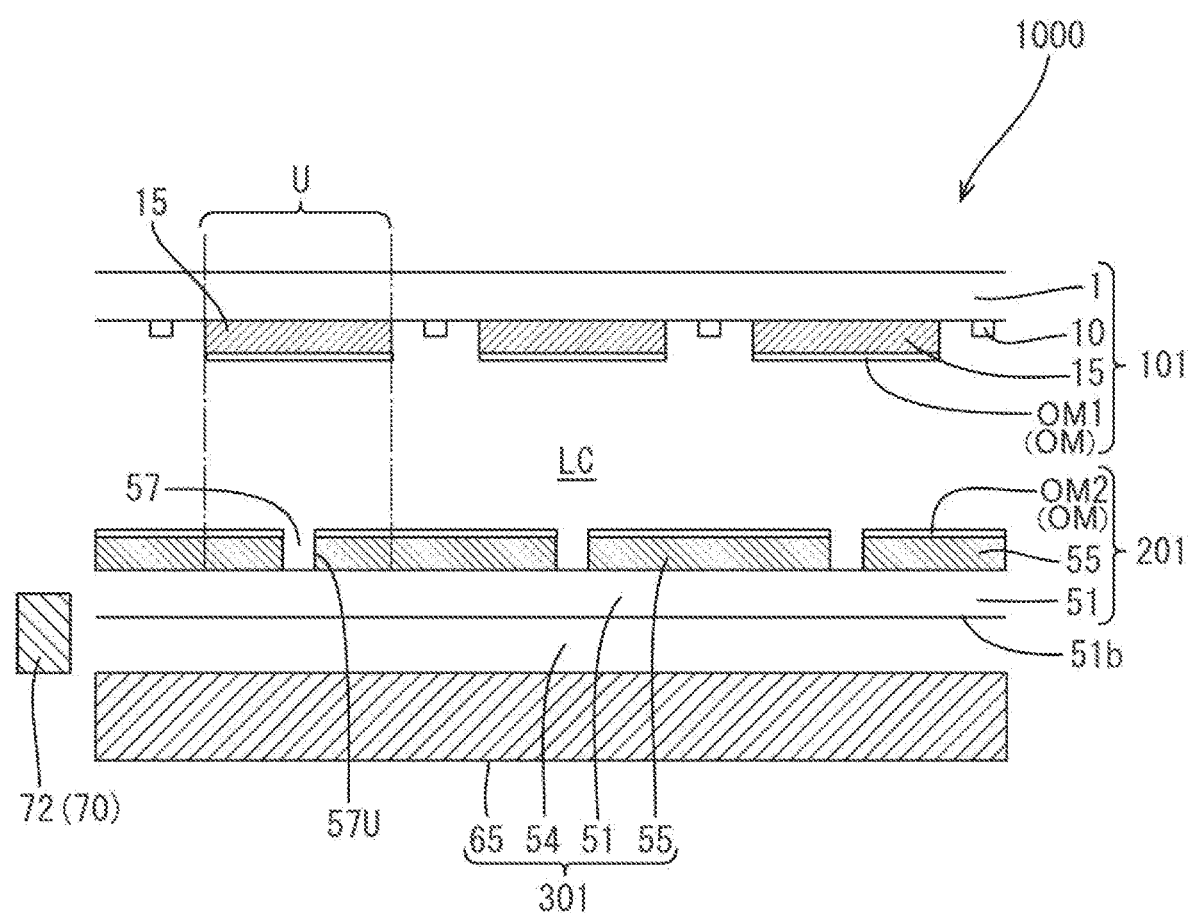
FIG. 1 is a cross-sectional view schematically illustrating a portion of a scanning antenna according to a first embodiment.

The basic structure of the scanning antenna according to an embodiment of the invention is described with reference to FIG. 1, for example. FIG. 1 is a cross-sectional view schematically illustrating a portion of a scanning antenna 1000 according to a first embodiment. The scanning antenna 1000 according to the embodiment is a radial in-line slot antenna in which slots 57 are concentrically arranged. FIG. 1 schematically illustrates a portion of the scanning antenna 1000 in cross-section taken in the radial direction from a feed pin 72 disposed near the center of the concentrically arranged slots. In some embodiments, the arrangement of the slots may be any of known arrangements (may be arranged in a spiral shape or in a matrix, for example).

The scanning antenna 1000 mainly includes a TFT board 101, a slot board 201, a liquid crystal layer LC between the boards 101 and 201, and a reflective conductive plate 65. The scanning antenna 1000 transmits and receives microwaves at a side adjacent to the TFT board 101. The TFT board 101 and the slot board 201 face each other with the liquid crystal layer LC therebetween.

The TFT board 101 includes a dielectric substrate 1 such as a glass substrate (one example of a first dielectric substrate), multiple patch electrodes 15 and multiple TFTs 10 (thin film transistors) that are disposed on a surface of the dielectric substrate 1 adjacent to the liquid crystal layer LC, and conductive alignment films OM1 closest to the liquid crystal layer LC. The conductive alignment films OM1 are disposed only on the patch electrodes 15. The TFTs 10 are each connected to a gate bus line and a source bus line, which are not illustrated in FIG. 1.

The slot board 201 includes a dielectric substrate 51 such as a glass substrate (one example of a second dielectric substrate), a slot electrode 55 on a surface of the dielectric substrate 51 adjacent to the liquid crystal layer LC, and dielectric alignment films OM2 closest to the liquid crystal layer LC. The conductive alignment films OM2 are disposed only on the slot electrode 55. The slot electrode 55 includes multiple slots 57. The surface of the dielectric substrate 51 adjacent to the liquid crystal layer LC is referred to as a first main surface and a surface opposite the first main surface is referred to as a second surface.

The dielectric substrates 1 and 51, which are included in the TFT board 101 and the slot board 201, preferably have small dielectric losses with respect to the microwaves and may be plastic substrates instead of the glass substrates. Although the dielectric substrates 1 and 51 may have any thickness, the thickness is preferably 400 µm or smaller and more preferably 300 µm or smaller. The dielectric substrates 1 and 51 have no lower thickness limit and may have any thickness if the strength is enough to undergo the production process, for example.

The reflective conductive plate 65 faces the slot board 201 with an air layer 54 therebetween. In other words, the reflective conductive plate 65 faces the second main surface of the dielectric substrate 51 (one example of a second dielectric substrate) of the slot board 201 with the air layer (dielectric layer) 54 therebetween. In some embodiments, a layer formed of a dielectric (for example, a fluorine resin such as PTFE) having a small dielectric constant M with respect to microwaves may be used instead of the air layer 54. In the scanning antenna 1000 according to the embodiment, the slot electrode 55, the reflective conductive plate 65, and the dielectric substrate 51 and the air layer 54, which are located between the slot electrode 55 and the reflective plate 65, function as a waveguide 301.

The patch electrode 15, a portion of the slot electrode 55 including a slot 57 (hereinafter, may be referred to as a "slot electrode unit 57U"), and the liquid crystal layer LC therebetween form an antenna unit U. In each antenna unit U, one island-shaped patch electrode 15 faces one slot 57 in the form of a hole (slot electrode unit 57U) with the liquid crystal layer LC therebetween to form a liquid crystal capacitor. The scanning antenna 1000 according to the embodiment includes the concentrically arranged antenna units U. The antenna unit U has an auxiliary capacitance electrically connected in parallel to the liquid crystal capacitor.

The slot electrode 55, which forms the antenna units U at the slot electrode units 57U, functions as a wall of the waveguide 301. The slot electrode 55 is required to reduce the transmission of microwaves and is formed of a relatively thick metal layer. Examples of the metal layer include a Cu layer and an Al layer. For example, a Cu layer having a thickness of 3.3 µm or larger or an Al layer having a thickness of 4.0 µm or larger is used to attenuate a microwave of 10 GHz to about 1/150. A Cu layer having a thickness of 1.9 µm or larger or an Al layer having a thickness of 2.3 µm or larger is used to attenuate a microwave of 30 GHz to about 1/150. The metal layer that forms the slot electrode 55 has no particular upper thickness limit. The metal layer formed of Cu is able to be thinner than that formed of Al. The slot electrode 55 may be formed by a thin film deposition method used in a known liquid crystal display device technology or other methods such as a method of bonding a metal foil (such as Cu foil or Al foil) to the substrate. For example, the slot electrode 55 has a thickness of not less than 1.5 µm and not more than 30 µm, preferably not less than 1.5 µm and not more than 5 µm. When a thin film deposition method is used to form the metal layer, the thickness of the slot electrode 55 is not more than 5 µm, for example. The reflective conductive plate 65 may be an aluminum plate or a copper plate that has a thickness of a few millimeters, for example.

The patch electrode 15, which does not form the waveguide 301 unlike the slot electrode 55, may be formed of a metal layer having a smaller thickness than that of the slot electrode 55, without departing from the scope of the invention. The patch electrode 15 preferably has a low resistance in order to avoid that the oscillation energy of free electrons near the slot 57 of the slot electrode 55 is converted into heat when inducing the oscillation of free electrons in the patch electrode 15. From the viewpoint of mass production, an Al layer is more preferable than a Cu layer. The thickness of the patch electrode 15 is preferably not less than 0.5 µm and not more than 10 µm, and more preferably not less than 1.5 µm and not more than 5 µm.

As described in Japanese Unexamined Patent Application Publication No. 2013-539949, the arrangement pitch of the antenna units U is set to $\lambda/4$ or less and/or $\lambda/5$ or less in which $\lambda$ is the wavelength of the microwave. The wavelength $\lambda$ may be 25 mm. In such a case, the arrangement pitch is set to 6.25 mm or less and/or 5 mm or less.

In the scanning antenna 1000, the phase of the microwave emitted (re-radiated) from each patch electrode 15 is changed by changing the capacitance of the liquid crystal capacitor of the antenna unit U. Thus, in the liquid crystal layer LC, the anisotropy ($\Delta\varepsilon M$) of the dielectric constant M ($\varepsilon M$) with respect to microwaves is preferably high, and tan$\delta M$ (dielectric tangent with respect to microwaves) is preferably small.

Although the dielectric constant of a liquid crystal material generally has frequency dispersion, the dielectric anisotropy $\Delta\varepsilon M$ with respect to microwaves has a positive correlation with the refractive index anisotropy $\Delta n$ with respect to visible light. Thus, a material having a high refractive index anisotropy $\Delta n$ with respect to visible light is preferable as a liquid crystal material for an antenna unit used for microwaves. The thickness of the liquid crystal layer LC is not less than 1 μm and not more than 500 μm, preferably not less than 2 μm and not more than 10 μm, and more preferably not less than 2.5 μm and not more than 5.5 μm. The thickness of the liquid crystal layer LC is the thickness between the slot electrode 55 and the patch electrode 15.

Figure 2:
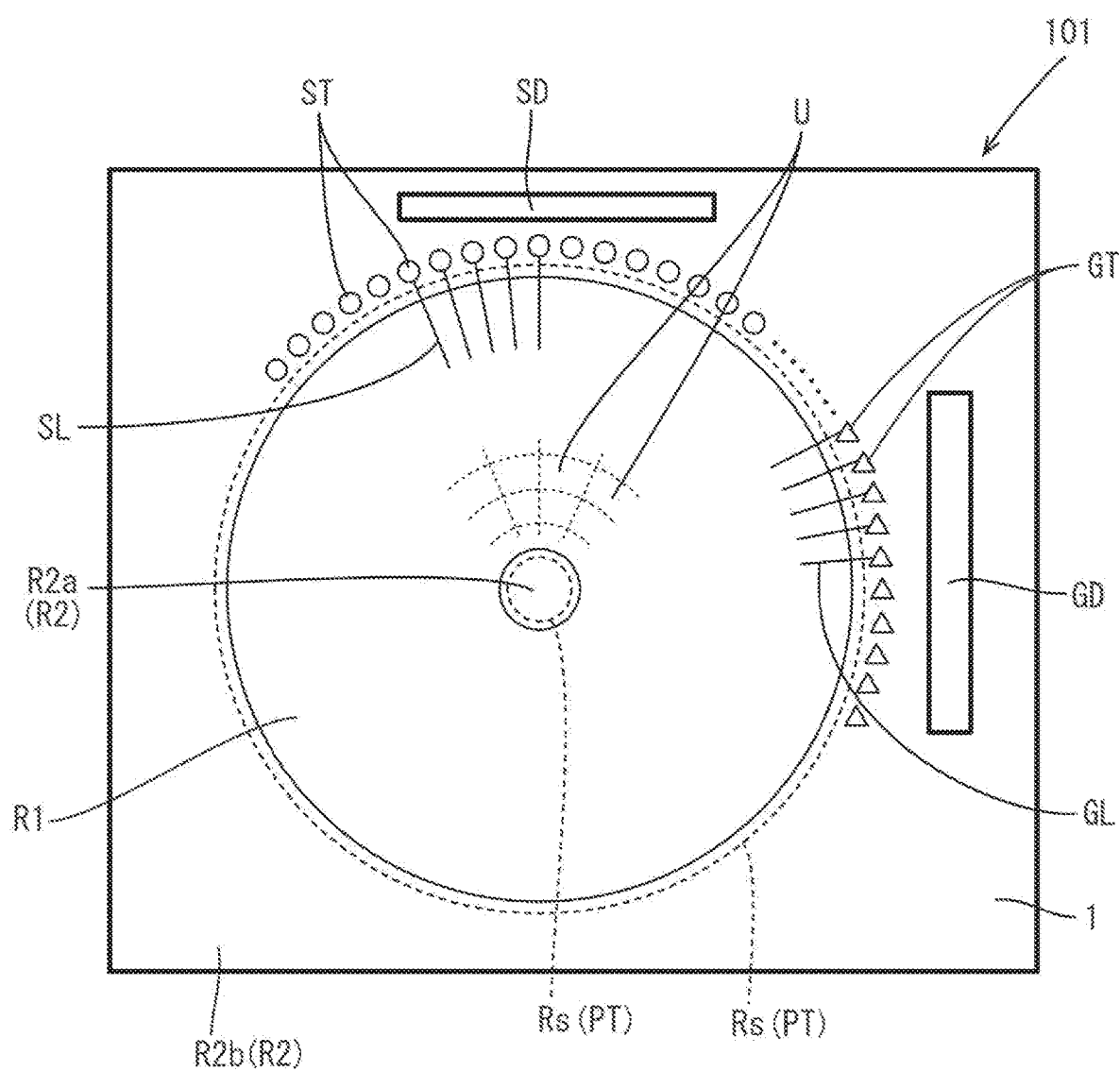
FIG. 2 is a plan view schematically illustrating a TFT board included in the scanning antenna.
Figure 3:
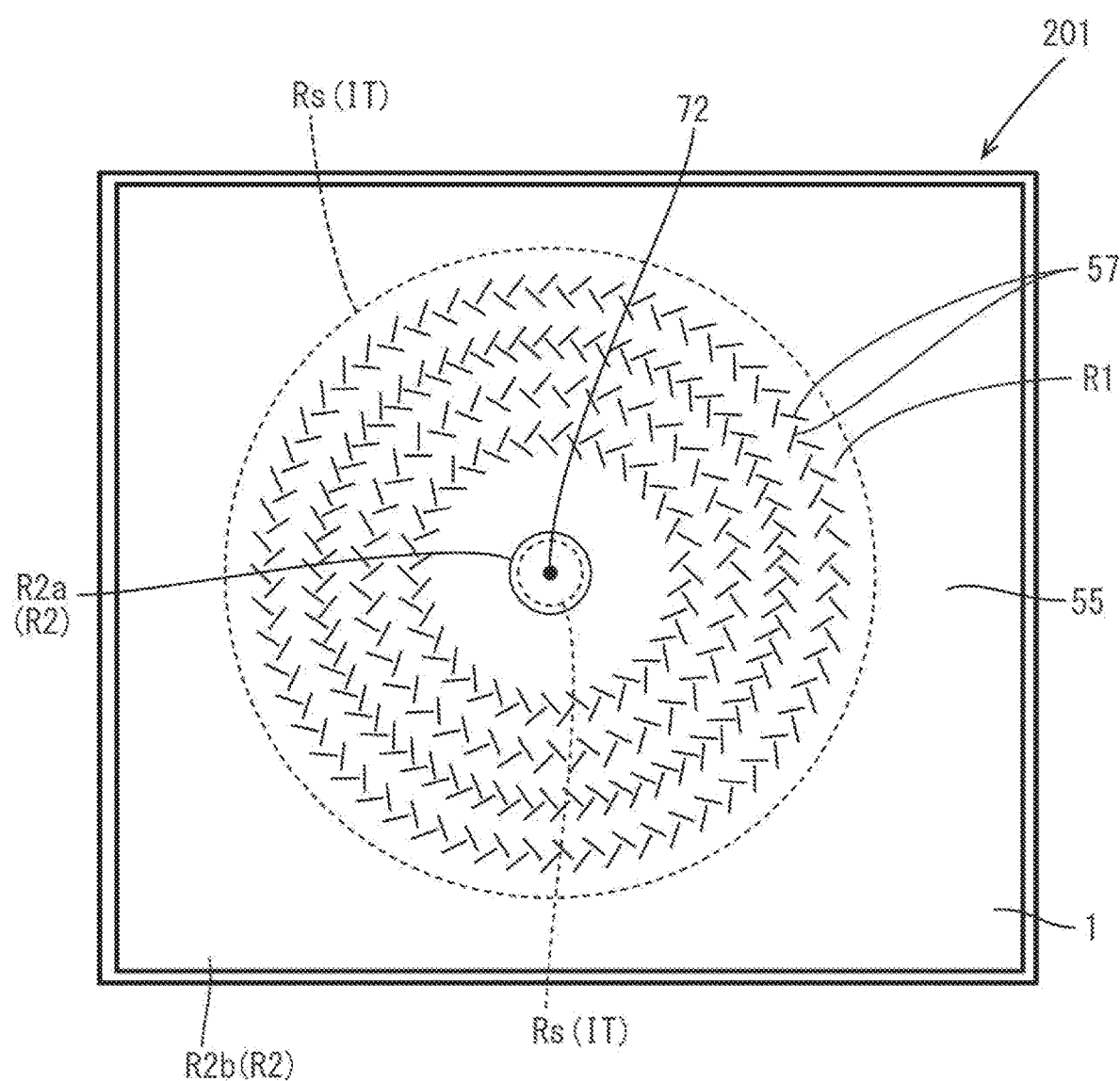
FIG. 3 is a plan view schematically illustrating a slot board included in the scanning antenna.

FIG. 2 is a plan view schematically illustrating the TFT board 101 included in the scanning antenna 1000. FIG. 3 is a plan view schematically illustrating the slot board 201 included in the scanning antenna 1000. The region of the TFT board 101 and the region of the slot board 201 corresponding to the antenna unit U are referred to as "antenna unit regions" and denoted with the same reference numeral as the antenna units. In addition, as illustrated in FIGS. 2 and 3, in the TFT board 101 and the slot board 201, a region including the two-dimensionally arranged antenna unit regions U is referred to as "transmission/reception region R1", and a region other than the transmission/reception region R1 is referred to as a "non-transmission/reception region R2". A terminal, a drive circuit, and other components are disposed in the non-transmission/reception region R2.

The transmission/reception region R1 has a ring-like shape in plan view. The non-transmission/reception region R2 includes a first non-transmission/reception region R2*a* located at substantially the center of the transmission/reception region R1 and a second non-transmission/reception region R2*b* located at the outer periphery of the transmission/reception region R1. The outer diameter of the transmission/reception region R1 is not less than 200 mm and not more than 1500 mm, for example, and is suitably determined according to the data traffic volume, for example.

Multiple gate bus lines GL and multiple source bus lines SL, which are supported by the dielectric substrate 1, are provided in the transmission/reception region R1 of the TFT board 101. The driving of the antenna unit region U is controlled by using these wiring lines. The antenna unit regions U each include the TFT 10 and the patch electrode 15 electrically connected to the TFT 10. The source electrode of the TFT 10 is electrically connected to the source bus line SL, and the gate electrode thereof is electrically connected to the gate bus line GL. In addition, the drain electrode of the TFT 10 is electrically connected to the patch electrode 15.

In the non-transmission/reception region R2 (first and second non-transmission/reception regions R2*a* and R2*b*), a seal region Rs having a sealant (not illustrated) surrounds the transmission/reception region R1. The sealant bonds the TFT board 101 and the slot board 201 to each other and also seals the liquid crystal material (liquid crystal layer LC) between these substrates 101 and 201.

Gate terminals GT, a gate driver GD, source terminals ST, and a source driver SD are disposed outside the seal region RS in the non-transmission/reception region R2. The gate bus lines GL are connected to the gate driver GD through the respective gate terminals GT. The source bus lines SL are connected to the source driver SD through the respective source terminals ST. Although the source driver SD and the gate driver GD are disposed on the dielectric substrate 1 of the TFT board 101 in this embodiment, one or both drivers may be disposed on the dielectric substrate 51 of the slot board 201.

In the non-transmission/reception region R2, multiple transfer terminals PT are disposed. The transfer terminals PT are electrically connected to the slot electrode 55 of the slot board 201. In this embodiment, the transfer terminals PT are disposed in both the first non-transmission/reception region R2*a* and the second non-transmission/reception region R2*b*. In some embodiments, the transfer terminals PT may be disposed in one of the first and second non-transmission/reception regions R2*a* and R2*b*. Furthermore, in the present embodiment, the transfer terminals PT are located in the seal region Rs. In this case, a conductive resin containing conductive particles (conductive beards) is used as the sealant.

As illustrated in FIG. 3, in the slot board 201, the slot electrode 55 on the dielectric substrate 51 is disposed over the transmission/reception region R1 and the non-transmission/reception region R2. FIG. 3 illustrates the surface of the slot board 201 viewed from the side of the liquid crystal layer LC. In FIG. 3, the conductive alignment film OM2 is not illustrated for ease of understanding.

In the transmission/reception region R1 of the slot board 201, the slot electrode 55 has multiple slots 57. The slots 57 correspond to the respective antenna unit regions U of the TFT board 101. In this embodiment, the slots 57 extending in directions substantially perpendicular to each other in pairs are concentrically arranged to form a radial inline slot antenna. Such pairs of slots 57 enable the scanning antenna 1000 to transmit and receive circularly polarized waves.

Multiple terminals IT of the slot electrode 55 are disposed in the non-transmission/reception region R2 of the slot board 201. The terminals IT are electrically connected to the transfer terminals PT of the TFT board 101. In this embodiment, the terminals IT are disposed in the seal region Rs and are electrically connected to the corresponding transfer terminals PT through the sealant formed of a conductive resin containing conductive particles (conductive beads) as described above.

Furthermore, in the first non-transmission/reception region R2*a*, a power supply pin 72 is disposed at substantially the center of the concentrically arranged slots 57. The power supply pin 72 emits microwaves to the waveguide 301, which is constituted by the slot electrode 55, the reflective conductive plate 65, and the dielectric substrate 51. The power supply pin 72 is connected to a power feeder 70. The power may be supplied by direct coupling or electromagnetic coupling. A known power supply mechanism may be employed.

Hereinafter, the TFT board 101, the slot board 201, and the waveguide 301 are described in detail.

Structure of TFT Board 101

Figure 4:
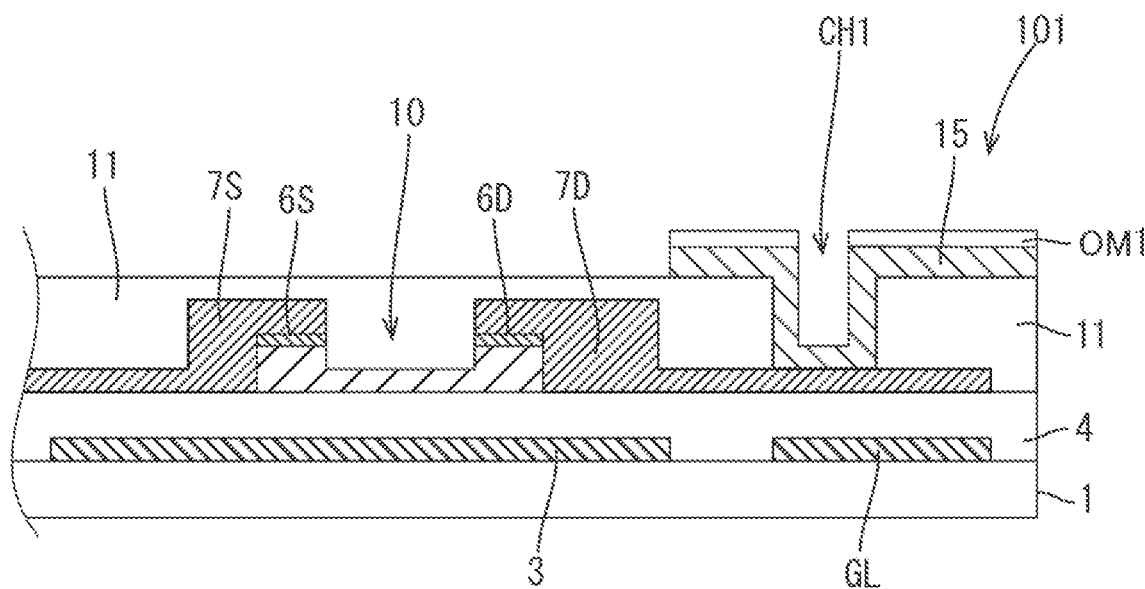
FIG. 4 is a cross-sectional view schematically illustrating an antenna unit region of the TFT board.
Figure 5:
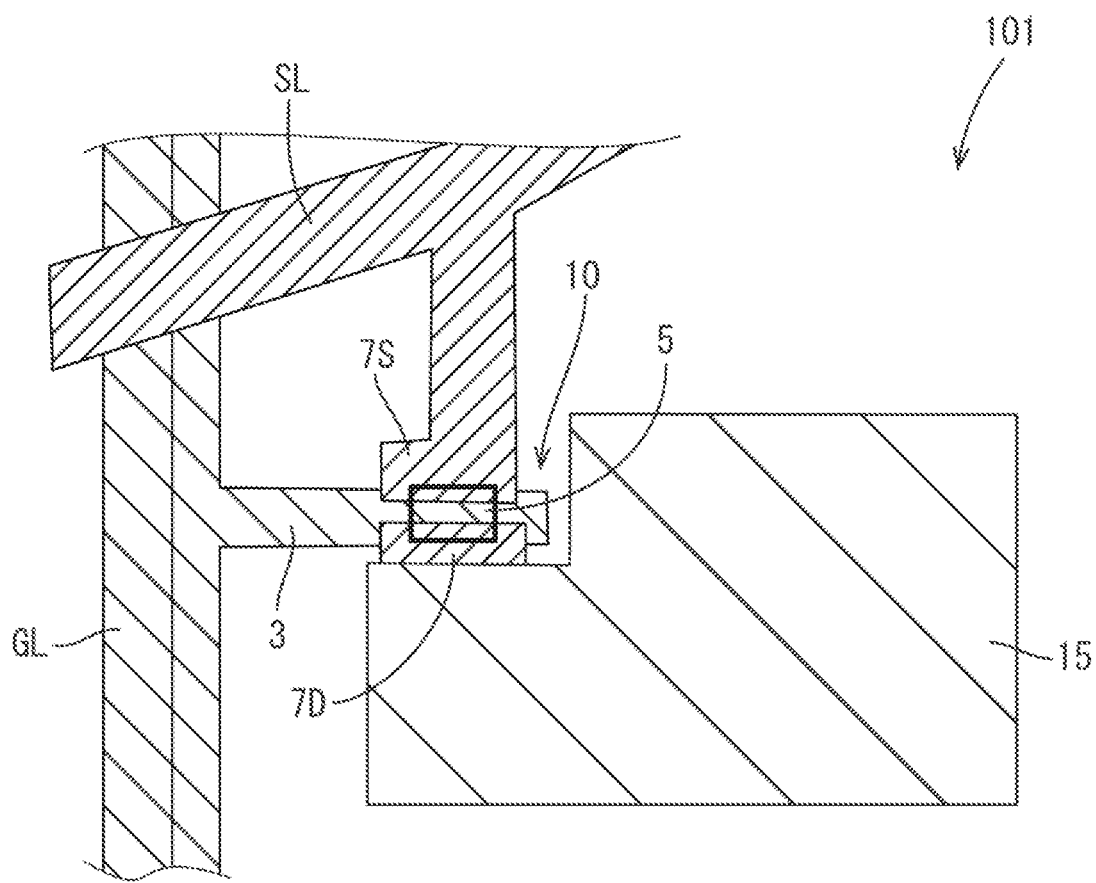
FIG. 5 is a plan view schematically illustrating the antenna unit region of the TFT board.

FIG. 4 illustrates a cross-sectional view schematically illustrating the antenna unit region U of the TFT board 101. FIG. 5 is a plan view schematically illustrating the antenna unit region U of the TFT board 101. FIG. 4 and FIG. 5 each illustrate a cross-sectional structure of a portion of the transmission/reception region R1.

The antenna unit regions U of the TFT board 101 each include the dielectric substrate (first dielectric substrate) 1, the TFT 10 supported by the dielectric substrate 1, a first insulating layer 11 covering the TFT 10, the patch electrode 15 disposed on the first insulating layer 11 and electrically connected to the TFT 10, and the conductive alignment film OM1 on the patch electrode 15.

The TFT 10 includes a gate electrode 3, an island-shaped semiconductor layer 5, a gate insulating layer 4 disposed between the gate electrode 3 and the semiconductor layer 5, a source electrode 7S, and a drain electrode 7D. In this embodiment, the TFT 10 is a channel-etched TFT having a bottom gate structure. In some embodiments, the TFT 10 may have a different structure.

The gate electrode 3 is electrically connected to the gate bus line GL to receive a scanning signal through the gate bus line GL. The source electrode 7S is electrically connected to the source bus line SL to receive a data signal through the source bus line SL. The gate electrode 3 and the gate bus line GL may be formed of the same conductive film (gate conductive film). The source electrode 7S, the drain electrode 7D, and the source bus line SL may be formed of the same conductive film (source conductive film). The gate conductive film and the source conductive film are metal films, for example. A layer formed of a gate conductive film may be referred to as a "gate metal layer". A layer formed of a source conductive film may be referred to as a "source metal layer".

The semiconductor layer 5 overlaps the gate electrode 3 with the gate insulating layer 4 therebetween. As illustrated in FIG. 4, a source contact layer 6S and a drain contact layer 6D are disposed on the semiconductor layer 5. The source contact layer 6S and the drain contact layer 6D on the semiconductor layer 5 are located on opposite sides of a region (channel region) that has a channel. In this embodiment, the semiconductor layer 5 is an intrinsic amorphous silicon (i-a-Si) layer, and the source contact layer 6S and the drain contact layer 6D are n+ amorphous silicon (n+-a-Si) layers. In some embodiments, the semiconductor layer 5 may be a polysilicon layer or an oxide semiconductor layer, for example.

The source electrode 7S is in contact with the source contact layer 6S to be connected to the semiconductor layer 5 through the source contact layer 6S. The drain electrode 7D is in contact with the drain contact layer 6D to be connected to the semiconductor layer 5 through the drain contact layer 6D.

The first insulating layer 11 has a contact hole CH1 extending to the drain electrode 7D of the TFT 10.

The patch electrode 15 is disposed on the first insulating layer 11 and in the contact hole CH1 where the patch electrode 15 is in contact with the drain electrode 7D. The patch electrode 15 includes a metal layer as a main component. The patch electrode 15 is preferably a metal electrode formed only of a metal layer. The material of the patch electrode 15 may be the same as that of the source electrode 7S and the drain electrode 7D. The thickness of the metal layer of the patch electrode 15 (the thickness of the patch electrode 15 when the patch electrode 15 is a metal electrode) may be equal to that of the source electrode 7S and the drain electrode 7D but is preferably greater. The patch electrode 15 having a large thickness has a low electromagnetic wave transmittance and has a lower sheet resistance, and thus the oscillation energy of free electrons in the patch electrode is less likely to be converted into heat.

A CS bus line CL formed of the same conductive film as that of the gate bus line GL may be disposed. The CS bus line CL overlaps the drain electrode 7D (or the extension of the drain electrode 7D) with the gate insulating layer 4 therebetween and may form an auxiliary capacitance CS including the gate insulating layer 4 as a dielectric layer.

In this embodiment, the patch electrode 15 is disposed in a layer that is not the source metal layer. This allows separate control of the thickness of the source metal layer and the thickness of the patch electrode 15.

The patch electrode 15 may include a Cu layer or an Al layer as a main layer. The performance of the scanning antenna has a correlation with the electric resistance of the patch electrode 15, and the thickness of the main layer is determined such that a predetermined resistance is obtained. The resistance of the patch electrode 15 is preferably low enough not to prevent electron oscillation. The thickness of the patch electrode 15 is preferably not less than 0.5 µm and not more than 10 µm, and more preferably not less than 1.5 µm and not more than 5 µm. The thickness of the patch electrode 15 is preferably not less than 1.5 µm to improve the antenna characteristics, for example.

The patch electrode 15 may be covered with a conductive protection film as needed. For example, if the patch electrode 15 contains copper (Cu), corrosion of the patch electrode 15 or diffusion of the material constituting the patch electrode 15 may occur. To prevent the problem, a conductive protection film (barrier metal) may cover the overall patch electrode 15. Examples of the conductive material that forms the conductive protection film include metals such as Ta, Ru, Ti, Zr, Hf, Co, V, Nb, Cr, Mo, W, and Mn and nitrides of theses metals. When the patch electrode 15 contains Cu, the conductive material is preferably Ta, Ru, or a nitride of Ta or Ru, i.e., TaN or RuN. The thickness of the conductive protection film is preferably in a range of about 1 nm to about 10 nm. The conductive protection film may nave a single-layer structure or a multi-layer structure including two or more layers formed of different materials.

The conductive alignment film OM1 is a conductive resin film. The conductive alignment film OM1 is described in detail later.

The TFT board 101 is produced by the following method, for example. First, the dielectric substrate 1 is provided. The dielectric substrate 1 may be a glass substrate or a heat-resistant plastic substrate, for example. A gate metal layer including the gate electrode 3 and the gate bus line GL is formed on the dielectric substrate 1.

The gate electrode 3 and the gate bus line GL may be integrally formed. Here, a gate conductive film (having a thickness of not less than 50 nm and not more than 500 nm) is formed by sputtering, for example, on the dielectric substrate 1. Then, the gate conductive film is patterned to form the gate electrode 3 and the gate bus line GL. Examples of the material of the gate conductive film include, but are not limited to, metals such as aluminum (Al), tungsten (W), molybdenum (Mo), tantalum (Ta), chrome (Cr), titanium (Ti), and copper (Cu), alloys of these metals, and metal nitrides of these metals. Here, a layered film in which a MoN film (thickness of 50 nm, for example), an Al film (thickness of 200 nm, for example), and a MoN film (thickness of 50 nm) are laminated in this order is formed as the gate conductive film.

Next, the gate insulating layer 4 is formed to cover the gate metal layer. The gate insulating layer 4 is formed by a CVD method, for example. The gate insulating layer 4 may be a silicon oxide ($SiO_2$) layer, a silicon nitride (SiNx) layer, a silicon oxynitride (SiOxNy; x>y) layer, or a silicon nitride oxide (SiNxOy; x>y) layer. The gate insulating layer 4 may have a layered structure. Here, the gate insulating layer 4 is a SiNx layer (thickness of 410 nm, for example).

Next, the semiconductor layer 5 and a contact layer are formed on the gate insulating layer 4. Here, an intrinsic amorphous silicon film (thickness of 125 nm, for example) and an n+ amorphous silicon film (thickness of 65 nm, for example) are formed in this order and patterned to obtain the island-shaped semiconductor layer 5 and the contact layer. The semiconductor film forming the semiconductor layer 5 is not limited to the amorphous silicon film. For example, the semiconductor layer 5 may be an oxide semiconductor layer. In such a case, the contact layer between the semiconductor layer 5 and the source/drain electrodes may be eliminated.

Next, the source conductive film (thickness of not less than 50 nm and not more than 500 nm, for example) is formed on the gate insulating layer 4 and the contact layer and patterned to form the source metal layer including the source electrode 7S, the drain electrode 7D, and the source bus line SL. At this time, the contact layer is also etched to be separated into the source contact layer 6S and the drain contact layer 6D away from each other.

Examples of the material of the source conductive film include, but are not limited to, films containing metals such as aluminum (Al), tungsten (W), molybdenum (Mo), tantalum (Ta), chromium (Cr), titanium (Ti), and copper (Cu), alloys of these metals, and nitrides of these metals. Here, the source conductive film is a layered film in which a MoN film (thickness of 30 nm, for example), an Al film (thickness of 200 nm, for example), and a MoN film (thickness of 50 nm, for example) are laminated in this order.

Here, for example, the source conductive film is formed by sputtering and then is patterned by wet etching (source/drain separation). Then, a portion of the contact layer corresponding to the region that becomes the channel region of the semiconductor layer 5 is removed by dry etching, for example, to form a gap portion. Thus, the contact layer is separated into the source contact layer 6S and the drain contact layer 6D. At this time, in the gap portion, the semiconductor layer 5 is also etched (over etching) at a portion near the surface.

Next, the first insulating layer 11 is formed to cover the TFT 10. In this example, the first insulating layer 11 is in contact with the channel region of the semiconductor layer 5. Furthermore, the contact hole CH1 extending to the drain electrode 7D is formed in the first insulating layer 11 by a known photolithographic method.

The first insulating layer 11 may be formed of an inorganic insulating film, such as a silicon oxide (SiO2) film, a silicon nitride (SiNx) film, a silicon oxynitride (SiOxNy; x>y) film, and a silicon nitride oxide (SiNxOy; x>y) film. Here, as the first insulating layer 11, a SiNx layer having a thickness of 330 nm, for example, is formed by a CVD method.

Next, the patch conductive film is formed on the first insulating layer 11 and in the contact hole CH1 and the patch conductive film is patterned. The patch electrodes 15 are formed in the transmission/reception region R1 in this way. In the non-transmission/reception region R2, a patch connection portion formed of the same conductive film (patch conductive film) as the patch electrode 15 is formed. The patch electrode 15 is in contact with the drain electrode 7D at a portion in the contact hole CH1.

The same material as that of the gate conductive film or the source conductive film may be used as the material of the patch conductive film. However, the patch conductive film preferably has a larger thickness than the gate conductive film and the source conductive film.

Here, the patch conductive film is a a layered film (MoN/Al/MoN) in which a MoN film (thickness of 50 nm, for example), an Al film (thickness of 1000 nm, for example), and a MoN film (thickness of 50 nm, for example) are laminated in this order.

Then, the conductive alignment film OM1 is formed on the patch electrode 15.

Subsequently, the inorganic insulating films (the first insulating layer 11 and the gate insulating layer 4) are collectively etched by dry etching using a fluorine-based gas, for example. In the etching, the patch electrode 15, the source bus line SL, and the gate bus line GL function as an etch stop. Thus, a second contact hole extending to the gate bus line GL is formed in the first insulating layer 11 and the gate insulating layer 4, and a third contact hole extending to the source bus line SL is formed in the first insulating layer 11.

Next, a conductive film (thickness of not less than 50 nm and not more than 200 nm) is formed by sputtering, for example, in the second and third contact holes. A transparent conductive film such as an indium tin oxide (ITO) film, an IZO film, and a zinc oxide (ZnO) film may be used as the conductive film. Here, an ITO film having a thickness of 100 nm, for example, is used as the conductive film.

Next, the transparent conductive film is patterned to form a gate terminal upper connection portion and a source terminal upper connection portion, for example. The gate terminal upper connection portion and the source terminal upper connection portion protect electrodes or wiring lines exposed at the terminals. The gate terminals GT and the source terminals ST are obtained in this way. The TFT board 101 is produced as above.

Structure of Slot Board 201

Figure 6:
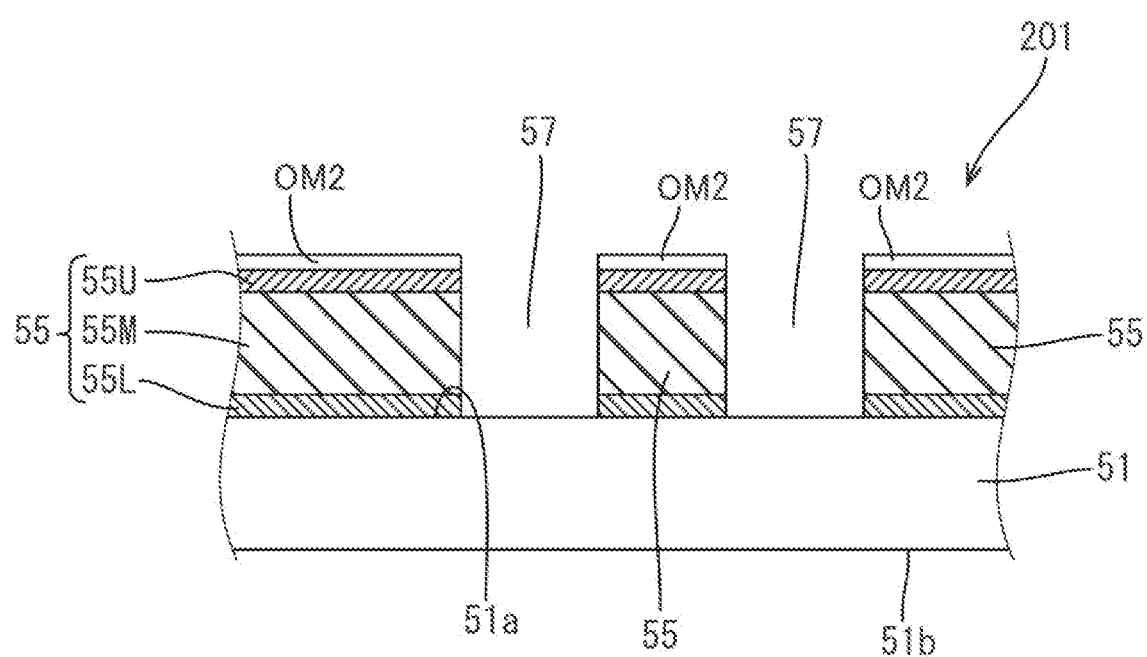
FIG. 6 is a cross-sectional view schematically illustrating the antenna unit region of the slot board.

Next, the structure of the slot board 201 is described in more detail. FIG. 6 is a cross-sectional view schematically illustrating an antenna unit region U of the slot board 201.

The slot board 201 mainly includes the dielectric substrate (second dielectric substrate) 51, the slot electrode 55 on a surface 51a (surface facing the liquid crystal layer and the TFT board 101) of the dielectric substrate 51, and the conductive alignment film OM2 on the slot electrode 55.

In the transmission/reception region R1 of the slot board 201, the slot electrode 55 has multiple slots 57 (FIG. 2). The slots 57 are openings (grooves) extending through the slot electrode 55. In this example, each antenna unit region U has one slot 57.

The slot electrode 55 includes a main layer 55M, such as a Cu layer and an Al layer. The slot electrode 55 may have a layered structure that further includes an upper layer 55U and a lower layer 55L sandwiching the main layer 55M. The thickness of the main layer 55M is determined depending on the material in view of the skin effect and may be not less than 2 μm and not more than 30 μm, for example. The thickness of the main layer 55M is usually greater than the thickness of the upper layer 55U and the lower layer 55L.

In this example, the main layer 55M is a Cu layer and the upper layer 55U and the lower layer 55L are Ti layers. The lower layer 55L between the main layer 55M and the dielectric substrate 51 improves the adhesion between the slot electrode 55 and the dielectric substrate 51. The upper layer 55U reduces corrosion of the main layer 55M (Cu layer, for example).

The slot electrode 55 may be covered with a conductive protection film as needed as the above-described patch electrode 15 of the TFT board 101.

The conductive alignment film OM2 is formed of a conductive resin film as the conductive alignment film OM1 of the TFT board 101. The conductive alignment film OM2 is described in detail later.

In the non-transmission/reception region R2 of the slot board 201, terminals IT are disposed (FIG. 3). The terminal IT includes a portion of the slot electrode 55 and an upper connection portion. The upper connection portion is in contact with a portion of the slot electrode 55. In this embodiment, the terminal IT is formed of a conductive film, such as an ITO film and an IZO film, and is disposed in the seal region Rs. The terminal IT is connected to the transfer terminal PT of the TFT board 101 by a seal resin containing conductive particles (conductive beads, such as Au beads).

The slot board 201 is produced by the following method, for example. First, the dielectric substrate 51 is provided. The dielectric substrate 51 may be a substrate having a high transmittance (small dielectric constant εM and small dielectric loss tan δM) with respect to electromagnetic waves, such as a glass substrate and a resin substrate. The dielectric substrate is preferably thin to reduce attenuation of the electromagnetic waves. For example, the glass substrate may be made thinner from the rear-side after the formation of the components such as the slot electrode 55 on the surface of the glass substrate, which is described later. This process allows the thickness of the glass substrate to be not more than 500 μm, for example. Generally, resin has a smaller dielectric constant εM and a smaller dielectric loss tan δM than glass. When the dielectric substrate 51 is a resin substrate, the thickness thereof is not less than 3 μm and not more than 300 μm, for example. The resin substrate may be formed of polyimide, for example.

A metal film is formed on the dielectric substrate 51 and is patterned to obtain the slot electrode 55 having the multiple slots 57. The metal film may be a Cu film (or Al film) having a thickness of not less than 1.5 μm and not more than 5 μm. Here, the metal film is a layered film in which a Ti film, a Cu film, and a Ti film are laminated in this order.

Subsequently, the upper connection portion formed of a transparent conductive film in contact with a portion of the slot electrode 55 is formed in the non-transmission/reception region R2. Thus, the terminal IT to be connected to the transfer terminal PT of the TFT board 101 is obtained.

Then, the conductive alignment film OM2 is formed on the slot electrode 55. The conductive alignment film OM2 is described in detail later. The slot board 201 is produced as above.

Structure of Waveguide 301

The waveguide 301 includes the reflective conductive plate 65 facing the slot electrode 55 with the dielectric substrate 51 therebetween. The reflective conductive plate 65 faces the rear surface of the dielectric substrate 51 with the air layer 54 therebetween. The reflective conductive plate 65 serves as a wall of the waveguide 301, and thus the thickness of the reflective conductive plate 65 is preferably three times or greater than the skin depth, and more preferably five times or greater than the skin depth. A cut-out aluminum plate or copper plate, for example, having a thickness of a few millimeters may be used as the reflective conductive plate 65.

For example, while the scanning antenna 1000 is in a transmission mode, the waveguide 301 allows the microwaves from the power supply pin 72, which is located at substantially the center of the concentrically-arranged antenna units U, to radiate toward the outside. The microwaves traveling through the waveguide 301 are cut at the slot 57 of the antenna unit U, generating an electrical field based on the slot antenna principle. The electric field induces electrical charges in the slot electrode 55 (i.e., the microwaves induce oscillation of free electrons in the slot electrode 55). In the antenna units U, the phase of the oscillation of free electrons induced in the patch electrode 15 is controlled by changing the capacitance of the liquid crystal capacitor through the alignment control of the liquid crystal layer. The electrical field is generated when the electrical charges are induced in the patch electrode 15 (i.e., oscillation energy is transferred from the free electrons in the slot electrode 55 to the free electrons in the patch electrode 15), and the microwaves (radio waves) are emitted from the patch electrode 15 of each antenna unit U toward the outside of the TFT board 101. The angle of direction of the beam is controlled by combining the microwaves (radio waves) from the antenna units U, which have different phases.

In some embodiments, the waveguide may have a two-layered structure including an upper layer and a lower layer. In such a case, the microwaves emitted by the power supply pin travels radially in the lower layer from the center toward the outer side and then travels upward at the outer wall of the lower layer to the upper layer. Then, the microwaves travel in the upper layer from the outer side to gather at the center. Such a two-layered structure allows the microwaves to readily uniformly spread over each antenna unit U.

Liquid Crystal LC

Since the liquid crystal material (liquid crystal molecule, liquid crystal compound) constituting the liquid crystal layer is required to have high dielectric anisotropy ($\Delta\varepsilon$) in the microwave range (GHz band), a highly polar liquid crystal material is preferably employed. For example, a preferable liquid crystal material is one having at least one functional group selected from the group consisting of a halogen group (F group, Cl group, Br group), an SCN group, an NCS group, a CN group, an OCN group, an NCO group, a $CF_3$ group, an $OCF_3$ group, and an $SF_5$ group, at a molecular end. Furthermore, the liquid crystal material preferably has at least one bond selected from the group consisting of carbon-carbon triple bond (acetylene bond), —CH=CH—, —CF=CF—, —CF=CH—, —CH=CF—, —(CO)O—, —C(CO)—, —CO—, and —O—. Such bond further increases the polarity of the liquid crystal molecules.

Since the above-described liquid crystal material has high dielectric anisotropy, the electrical capacitance largely varies with a liquid crystal orientation change caused by voltage application. Thus, the employment of such a liquid crystal material enables production of a higher-directive and higher-gain scanning antenna.

Conductive Alignment Film OM (OM1, OM2)

The conductive alignment films OM1 and OM2 (hereinafter, may be collectively referred to as "alignment film OM") included in the TFT board 101 and the slot board 201 of the embodiment are formed of a conductive resin film. The conductive resin film may be one formed of a polymer having conductivity (i.e., resin film formed of a conductive polymer) or one including a conductive filler added to an insulating resin film (i.e., resin film further including a conductive filler).

The conductive polymer included in the conductive alignment film may be any conductive polymer without departing from the scope of the invention. Examples of the conductive polymer include polyacetylene, polydiacetylene, polyyne, polyphenylene, polynaphthalene, polyfluorene, polyanthracene, polypyrene, polyazulene, polypyrrol, polythiophene, polyflan, polyselenophene, polyisothianaphtene, polyoxadiazole, polyaniline, polythiazyl, polyphenylene vinylene, polythienylenevinylene, polyacene, polyphenanthrene, polyperinaphthalene, and derivatives thereof. These polymers may be used alone or in combination.

As the conductive polymer, a polythiophene conductive polymer is preferably used because of its high conductivity, high film formation properties, and nigh stability, for example. The polythiophene conductive polymer may be PEDOT:PSS, which is described later, for example.

The conductive polymer generally has a long-conjugated system in the molecular structure, and thus has a color or has a low transmittance to visible light. However, since the conductive polymer does not need to be optically transparent when used in antennas, the conductive polymer is able to form the conductive alignment film OM.

Furthermore, when a resin film formed of a conductive polymer is used as the conductive alignment film OM, the resin film may further include a component other than the conductive polymer as needed without departing from the scope of the invention.

When the resin film including a conductive filler is used as the conductive alignment film OM, the resin film may be formed of a material widely used for an alignment film, such as polyimide and polyamic acid. The resin film is preferably formed of polyimide and/or polyamic acid. Any conductive filler may be used without departing from the scope of the invention. Examples of the conductive filler include carbon based conductive materials such as carbon black and carbon nanotube, metals such as aluminum, titanium, silver, gold, copper, and nickel, metal oxides such as yttrium oxide and tin oxide, ion conductive materials such as potassium titanate and lithium chloride, and conductive polymer fillers such as polyaniline, polypyrrol, polysulfone and polyacetylene. The conductive fillers may be used alone or in combination. The metals such as aluminum, titanium, silver, gold, copper, and nickel may be in the form of particles or in other forms such as the form of wire.

The conductive filler is preferably at least one selected from the group consisting of carbon black, a carbon nanotube, a silver nanoparticle, and a silver nanowire.

The conductive filler may be added (contained) in any amount without departing from the scope of the invention. The content of the conductive filler in the conductive alignment film is preferably 1% by mass or more.

When the resin film including the conductive filler is used as the conductive alignment film OM, the resin film may include a component other than the conductive filler as needed without departing from the scope of the invention.

The surface resistance of the conductive alignment film OM may be any value without departing from the scope of the invention, but preferably less than $1 \times 10^7 \Omega/\square$. The method of determining the surface resistance is described in detail later.

An alignment film solution including a predetermined solvent added to the conductive polymer, for example, is suitably applied to the surface of the patch electrode 15 of the TFT board 101 and the surface of the slot electrode 55 of the slot board 201 by using a known coating/printing technology, such as an inkjet printing method. The applied film is cured by heating, and then the cured film is subjected to an alignment treatment, such as a rubbing process. Thus, the conductive alignment film OM is obtained.

The conductive alignment films OM (OM1, OM2) allow, when no voltage is applied across the patch electrode 15 and the slot electrode 55, the liquid crystal molecules lc included in the liquid crystal layer LC to align in the horizontal direction (FIG. 7) by using its liquid crystal alignment control force. In other words, the conductive alignment films OM allow the liquid crystal molecules lc to align in parallel to (horizontally) the TFT board 101 and the slot board 201 by using the liquid crystal alignment control force.

When the conductive alignment films OM are used as alignment films on the patch electrode 15 of the TFT board 101 and on the slot electrode 55 of the slot board 201 as in the present embodiment, the conductive alignment film OM virtually does not form a capacitor (has no capacitance) as described later. Thus, the tunability of the capacitance obtained by ON/OFF switching of the liquid crystal layer corresponds to tunability of the antenna element. With this configuration, the liquid crystal cell C of the embodiment has a highly variable capacitance.

In this embodiment, the conductive alignment film OM is disposed on both the plurality of patch electrodes 15 and the slot electrode 55, but the invention is not limited thereto. In some embodiments, the conductive alignment film OM is disposed on at least one of the plurality of patch electrodes 15 and the slot electrode 55.

In this embodiment, the conductive alignment film OM1 is formed on the TFT board 101 only over the patch electrode 15 and the conductive alignment film OM2 is formed on the slot board 201 only over the slot electrode 55. In a liquid crystal cell C for a scanning antenna, one electrode is larger than that in a known liquid crystal cell for an image display. This allows the conductive alignment film OM to be selectively disposed only on the electrodes as in the present embodiment. However, as described later, the conductive alignment films OM may be disposed not only on the electrodes 15 and 55 of the boards 101 and 201, but also on the peripheral portions thereof to reduce the time required for the formation of the alignment films and to improve mass productivity, for example.

Antenna Unit U

Figure 7:
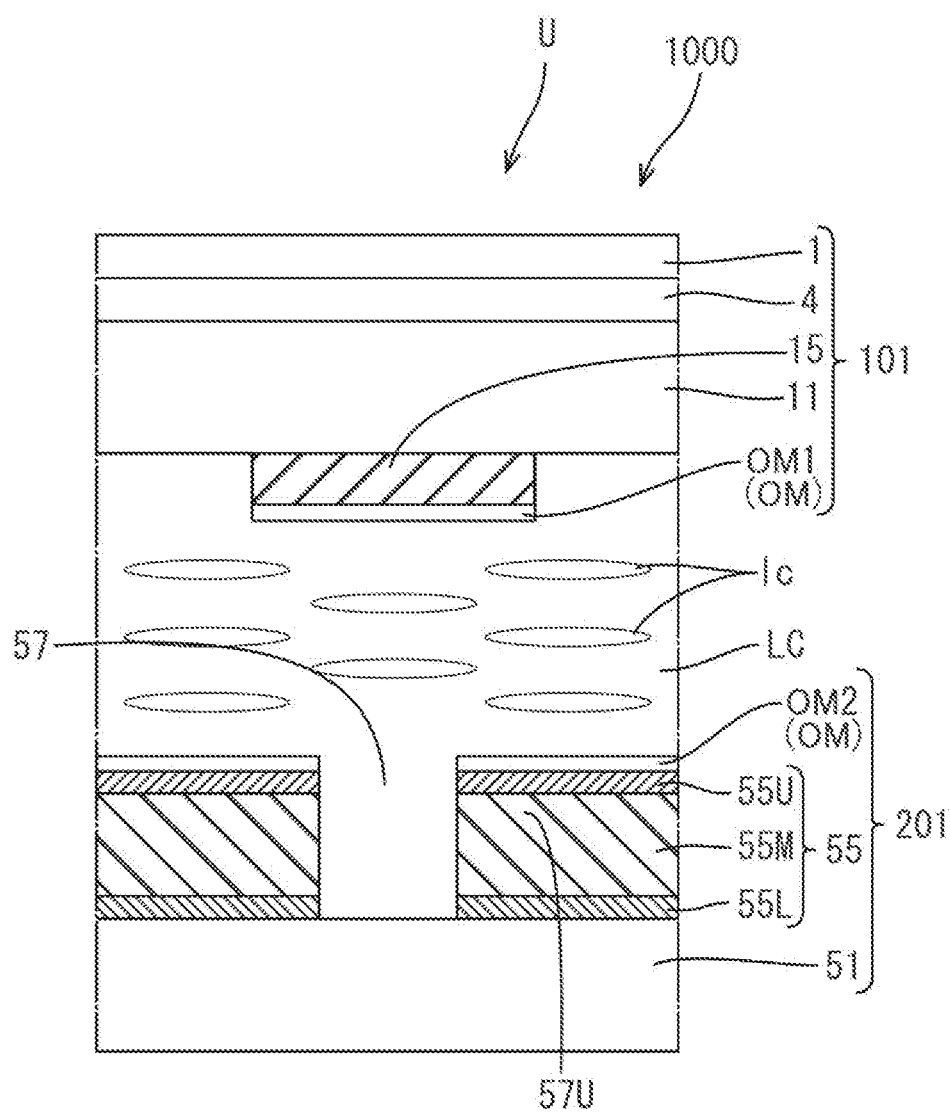
FIG. 7 is a cross-sectional view schematically illustrating the TFT board, the liquid crystal layer, and the slot board, which are included in the antenna unit of the scanning antenna.

FIG. 7 is a cross-sectional view schematically illustrating the TFT board 101, the liquid crystal layer LC, and the slot board 201, which constitute the antenna unit U of the scanning antenna 1000. As illustrated in FIG. 7, in the antenna unit U, the island-shaped patch electrode 15 of the TFT board 101 faces the hole-shaped (groove-shaped) slot 57 (slot electrode unit 57U) included in the slot electrode 55 of the slot board 201 with the liquid crystal layer LC therebetween. The scanning antenna 1000 having such a configuration includes a liquid crystal cell including the liquid crystal layer LC and two boards, the TFT board 101 and the slot board 201, which sandwich the liquid crystal layer LC therebetween and include the conductive alignment films OM1 and OM2 on the surfaces adjacent to the liquid crystal layer LC. In this specification, the antenna unit U includes one patch electrode 15 and a portion of the slot electrode 55 (slot electrode unit 57U) having at least one slot 57 corresponding to the patch electrode 15.

A sealant (not illustrated) is disposed between the TFT board 101 and the slot board 201, which constitute the liquid crystal cell C, to surround the liquid crystal layer LC. The sealant is applied to each of the TFT board 101 and the slot board 201 to bond the TFT board 101 and the slot board 201 together. The TFT board 101 and the slot board 201 are two opposing boards that face each other with the liquid crystal layer LC therebetween.

The sealant is a cured sealant composition containing a curable resin. The sealant composition is basically an inorganic sealant composition. The curable resin includes a photocurable resin that is cured by light (such as ultraviolet light and visible light) and/or thermosetting resin that is cured by heat. The kind of sealant is suitably determined depending on the method of injecting the liquid crystal material. For example, when the liquid crystal material is injected into the liquid crystal cell C by a one drop fill process (ODF process), the curable resin may be a photocurable (visible light curing resin, for example) and thermosetting resin, because the curing of such a resin is readily controlled by two steps of a pre-curing step and a main curing step, for example. An example of such a curable resin is a mixture of an epoxy resin and an acrylic resin (trade name "UVAC1561" available from Daicel-UCB Company, Ltd), for example. When the liquid crystal material is injected into the liquid crystal cell C by a vacuum injection method, the curable resin may be a photocurable resin or a thermosetting resin.

Method of Producing Scanning Antenna

In the production of the scanning antenna, the liquid crystal layer LC is sealed between the TFT board 101 and the slot board 201. A one drop fill process (ODF process) or a vacuum injection method may be used to seal the liquid crystal material (liquid crystal compound) that forms the liquid crystal layer LC between the TFT board 101 and the slot board 201 as in production of known liquid crystal display panels.

First, a sealant composition for an ODF process is applied onto one of the TFT board 101 and the slot board 201 (here, TFT board 101) in a frame-like shape by a sealant dispenser. The sealant composition includes a thermosetting epoxy resin, for example.

Next, the liquid crystal material is applied within the frame by an ODF process. Then, the board (TFT board 101) and the other board (slot board 201) are bonded together to sandwich the sealant composition and the liquid crystal material. Then, heat is applied to cure the sealant composition and to realign the liquid crystal molecules. The liquid crystal cell C is produced in this way.

Next, the reflective conductive plate 65 is attached to the liquid crystal cell C such that the reflective conductive plate 65 faces the second main surface of the slot board 201 (second dielectric substrate 51) of the liquid crystal cell C with the dielectric layer (air layer) 54 therebetween. The scanning antenna of the embodiment is produced in this way.

In the above-described embodiment, the liquid crystal cell for a scanning antenna is described as an example. The liquid crystal cell may be used in other devices (for example, a liquid crystal lens including a liquid crystal material as an optical element and configured to control a focal length by application of voltage) without departing from the scope of the invention.

EXAMPLES

Hereinafter, the invention is described further in detail with reference to Examples, but the invention is not limited to Examples.

Example 1

Production of Liquid Crystal Cell for Scanning Antenna

Figure 8:
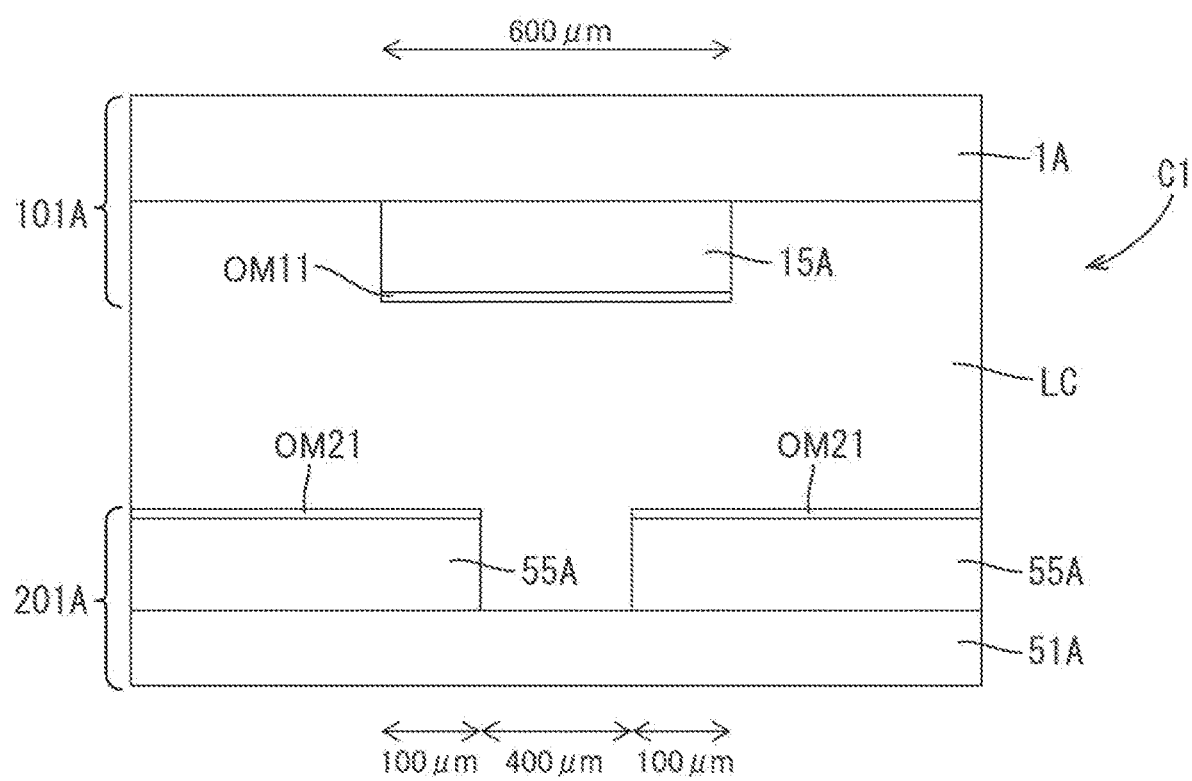
FIG. 8 is a cross-sectional view schematically illustrating a configuration of a liquid crystal cell of Example 1.

A liquid crystal cell C1 having the configuration illustrated in FIG. 8 was produced by the following method. First, a TFT board 101A having substantially the same structure as the above-described TFT board 101 but not having a conductive alignment film OM11 and a slot board 201A having substantially the same structure as the above-described slot board 201 but not having a conductive alignment film OM21 were provided. A patch electrode 15A of the TFT board 101 and a slot electrode 55A of the slot board 201A were both formed of Cu. The thickness of the patch electrode 15A was 1 μm and thickness of the slot electrode 55A was 2 μm. Furthermore, as indicated in FIG. 8, the width of the patch electrode 15A was set to 600 μm, the distance between the slot electrodes 55A was set to 400 μm, and the length of a portion where the slot electrode and the patch electrode overlap each other (overlapping length) was set to 100 μm.

Figure 9:
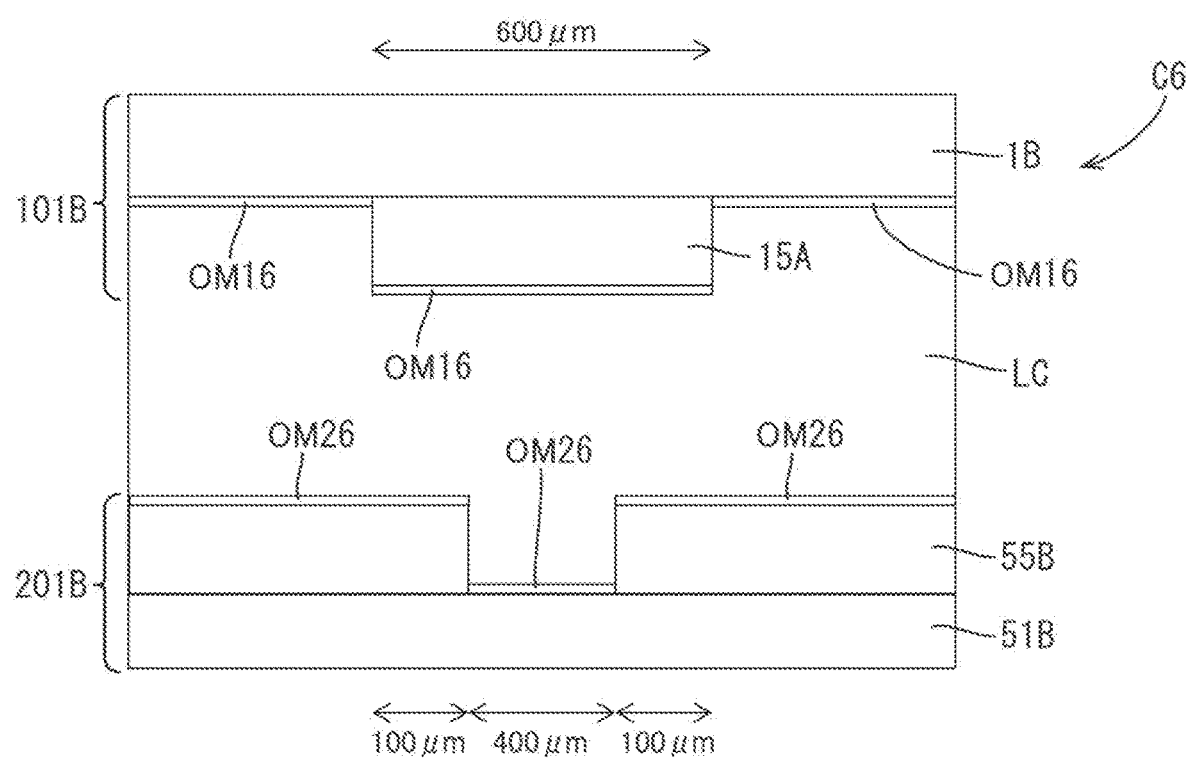
FIG. 9 is a cross-sectional view schematically illustrating a configuration of a liquid crystal cell of Example 6.
Figure 10:
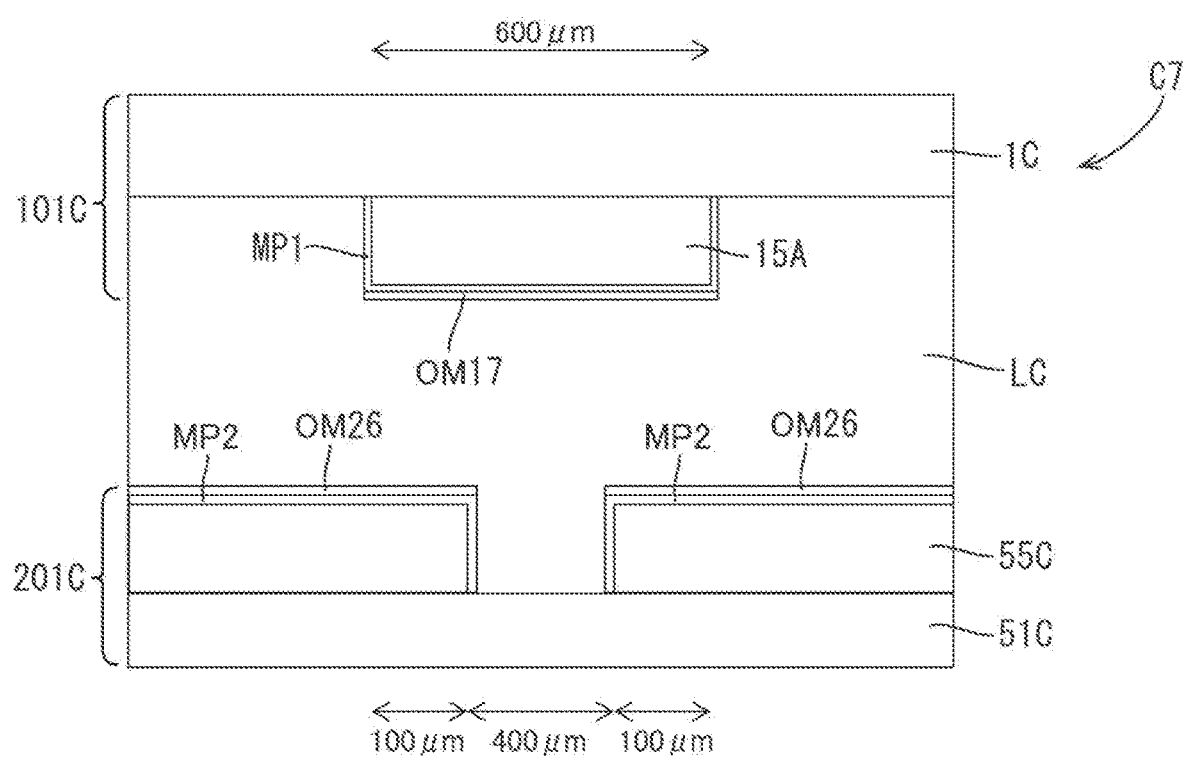
FIG. 10 is a cross-sectional view schematically illustrating a configuration of a liquid crystal cell of Example 7.

In FIG. 8, the TFT board 101A and the slot board 201A are each schematically illustrated for ease of understanding. The patch electrode 15A is disposed on a first dielectric substrate 1A and the slot electrode 55A is disposed on a second dielectric substrate 51A. FIG. 9 and FIG. 10, which are described later, are illustrated in the same way.

An alignment film solution containing polyaniline as a main component was applied onto the patch electrode 15A and the slot electrode 55A on the respective substrates by an ink-jet method. As a solvent of the alignment film solution, a mixed solvent including N-Methyl-2-pyrrolidone (NMP) and N,N-dimethylformamide (DMF) in a ratio (volume ratio) of 1:1 was used. The solid content concentration of the alignment film solution was 50% by mass.

The coated films on the substrates were heated at 70° C. for five minutes and then heated at 150° C. for 30 minutes. Then, the heated coated films were subjected to an alignment treatment by rubbing. Thus, the conductive alignment films OM11 and OM21 were formed on the electrodes 15A and 55A of the TFT board 101A and the slot board 201A.

A thermosetting sealant (trade name "HC-1413FP" available from Mitsui Chemicals, Inc.) was applied onto the surface of the TFT board 101A (adjacent to the liquid crystal layer LC) in a frame-like shape by a sealant dispenser, and a liquid crystal material ($\Delta\varepsilon$=20, 1 kHz, 20° C.) was applied within the frame by an ODF method. Then, the slot board 201A was bonded to the TFT board 101A by using the thermosetting sealant. Then, the assembly was heated at 130° C. for 40 minutes to cure the thermosetting sealant and to realign the liquid crystal molecules. Thus, the liquid crystal cell C1 for a scanning antenna of Example 1 in which the liquid crystal molecules were uniformly uniaxially oriented was obtained.

Comparative Example 1

As an alignment film solution that forms an alignment film, an alignment film solution containing polyimide as a main component was provided. As a solvent of the alignment film solution of Comparative Example 1, a mixed solvent including NMP and BCS (butyl cellosolve) in a ratio (volume ratio) of 1:1 was used. The solid content concentration of the alignment film solution was 50% by mass. A liquid crystal cell of Comparative Example 1 was produced in the same way as that of Example 1 except that the alignment film solution of Comparative Example 1 was used instead of the alignment film solution of Example 1 and the coated film formed of the alignment film solution was heated at 70° C. for five minutes and further heated at 200° C. for 30 minutes.

Capacitance Modulation Evaluation

Precision LCR Meter (4248A) available from Hewlett-Packard was used to determine the CV waveform. The application voltage was 30 Hz, 15V, and a square wave voltage. The capacitance ON/OFF modulation $\alpha$=(Con−Coff)/Coff was calculated in which Coff was a capacitance at 0 V and Con was a capacitance at 15 V. The modulation a may be expressed as ΔC/Coff or Con/(Coff−1).

The capacitance modulation of the antenna unit (antenna element) was determined by using the liquid crystal cell C1 of Example 1. The obtained capacitance modulation α was 1.4. The capacitance modulation of the antenna unit was also determined by using the liquid crystal cell of Comparative Example 1. The obtained capacitance modulation α was 0.94. It was confirmed that the conductive alignment films OM11 and OM22 in Example 1 increased the modulation α of the antenna unit.

In the scanning antenna (liquid crystal antenna) including the liquid crystal cell C1, the liquid crystal alignment is controlled (alignment of the liquid crystal molecules is switched between the horizontal alignment and the vertical alignment) by application of driving voltage to change the capacitance of the liquid crystal capacitor Clc, and thus the phase of the wave (oscillation of electrons) induced at the patch electrode 15A is controlled. The direction of the antenna beam is controlled by using the ON/OFF pattern (interference pattern). Thus, as the capacitance ON/OFF ratio of the liquid crystal layer increases, directivity and gain of the antenna increases.

When a widely-used alignment film formed of an insulating material (polyimide film) is used as in Comparative Example 1, the layer of the alignment film is a capacitor, and the capacitance of the antenna unit is a total of the capacitance of the liquid crystal layer and the capacitance of the alignment film. Thus, the total capacitance of the antenna unit is less variable.

In contrast, as in Example 1, when the alignment films OM11 and OM21 are formed of polyaniline, which is a conductive polymer, the alignment films OM11 and OM21 virtually does not form capacitors (have no capacitance). The capacitance tunability obtained by ON/OFF switching of the liquid crystal layer corresponds to the tunability of the antenna element as it is. Thus, in Example 1, the capacitance largely changes. As described above, in Example 1, a high-directive and high-gain liquid crystal cell C1 for a scanning antenna (liquid crystal antenna) was obtained.

Film Resistance Measurement

The sheet resistance (surface resistance or film resistance) was measured for each of the conductive alignment film OM11 in Example 1 and the alignment film in Comparative Example 1 for reference. A low resistivity meter LORESTA-GP MCP-T600 available from. Mitsubishi Chemical Corporation was used for the conductive alignment film OM11 of Example 1, which is a conductor (low resistance). The film resistance was determined for each alignment film in other Examples, which are described below, in the same way. A high resistivity meter Hiresta-UP MCP-HT450 available from Mitsubishi Chemical Corporation was used for the alignment film of Comparative Example 1, because polyimide is an insulator (high resistance). The surface resistance of the conductive alignment film OM11 of Example 1 was 2000Ω/□. The surface resistance of the alignment film of Comparative Example 1 was $3 \times 10^{13} \Omega/\square$.

Example 2

An alignment film solution of Example 2 that contains a polythiophene-based conductive polymer (PEDOT:PSS) as a main component was provided as an alignment solution that forms an alignment film. The polythiophene-based conductive polymer includes poly(3,4-ethylenedioxythiophene) doped with poly(styrene sulfonic acid). A liquid crystal cell of Example 2 was produced in the same way as that of Example 1, except that the alignment film solution of Example 2 was used instead of the alignment film solution of Example 1.

The capacitance modulation α of the antenna unit was determined for the liquid crystal cell in Example 2 in the same way as in Example 1. The obtained capacitance modulation α was 1.7. Furthermore, the surface resistance of the conductive alignment film of the liquid crystal cell in Example 2 was measured. The obtained surface resistance was 300 Ω/□.

As in this example, when a polythiophene conductive polymer is used as the material of the conductive alignment film, high conductivity is obtained, and further high film formation properties and high stability of the film are obtained. The conductive polymer used in the conductive alignment film may be any conductive polymer that allows liquid crystals to be horizontally aligned but is preferably a polythiophene conductive polymer used in Example 2 because of the above-described reasons. The alignment film for a liquid crystal antenna does not need to transmit visible light unlike the alignment film for a liquid crystal display, and thus the alignment film for a liquid crystal antenna may be formed of a material having a low visible light transmission.

Example 3

As an alignment film solution that forms an alignment film, a solution mainly containing polyamic acid and containing carbon black in a ratio of 20% by mass was provided. A liquid crystal cell of Example 3 was produced in the same way as that of Example 1, except that the alignment film solution of Example 3 was used instead of the alignment film solution of Example 1.

The capacitance modulation α of the antenna unit was determined for the liquid crystal cell in Example 3 in the same way as in Example 1. The obtained capacitance modulation α was 1.8. Furthermore, the surface resistance of the conductive alignment film in the liquid crystal cell of Example 3 was measured. The obtained surface resistance was 800 Ω/□.

As in this example, the conductive alignment film may be formed of a material containing a conductive filler such as carbon black in addition to a component commonly used to form an alignment film (for example, polyimide).

Example 4

As an alignment film solution that forms an alignment film, a solution containing polyamic acid as a main component and containing silver nanowires in an amount of 10% by mass was provided. A liquid crystal cell of Example 4 was produced in the same way as that of Example 1, except that the alignment film solution of Example 4 was used instead of the alignment film solution of Example 1.

The capacitance modulation α of the antenna unit was determined for the liquid crystal cell in Example 4 in the same way as in Example 1. The obtained capacitance modulation α was 1.8. Furthermore, the surface resistance of the conductive alignment film (conductive polyimide film) in the liquid crystal cell of Example 4 was measured. The obtained surface resistance was 300 Ω/□.

As in this example, the conductive alignment film may be formed of a material containing silver nanowires in addition to a component commonly used to form am alignment film.

The silver nanowire used in this example allows the polyimide as the main component to exhibit its reliability, film formation properties, mass productivity, and seal adhesion, for example, because conductivity is provided with less silver nanowires than carbon black used in Example 3.

Example 5

An alignment film solution of Example 5 was provided in the same way as that in Example 4, except that the amount of silver nanowires was changed to 1% by mass. A liquid crystal cell of Example 5 was produced in the same way as that of Example 1, except that the alignment film solution of Example 5 was used instead of the alignment film solution of Example 1.

The capacitance modulation α of the antenna unit was determined for the liquid crystal cell in Example 5 in the same way as in Example 1. The obtained capacitance modulation α was 1.5. Furthermore, the surface resistance of the conductive alignment film (conductive polyimide film) in the liquid crystal cell of Example 5 was measured. The obtained surface resistance was $5 \times 10^6 \Omega/\square$.

This example contains less silver nanowires than Example 4. It was confirmed from the results of Examples 4 and 5 that the conductivity (conductance) of the alignment film increases as the amount of the silver nanowires increases. Furthermore, as the amount of silver nanowires decreases, the ratio of polyimide as the main component increases. This improves the seal adhesion strength and the film formation properties of the alignment film.

Example 6

As illustrated in FIG. 9, a liquid crystal cell C6 of Example 6 includes a conductive alignment film OM16 not only on the patch electrode 15B of the TFT board 101B but also on a surface of a dielectric substrate 1B having the patch electrode 15B thereon. In the same way, a conductive alignment film OM26 is disposed not only on the slot electrode 55B of the slot board 201B but also on a surface of a conductive substrate 51B having the slot electrode 55B thereon. The conductive alignment films OM16 and OM26 in Example 6 are formed of a polythiophene conductive polymer as the alignment film in Example 2.

A liquid crystal cell C6 of Example 6 was produced in the same way as that in Example 2, except that the formation area of the conductive alignment films OM16 and OM26 was different as above.

The capacitance modulation α of the antenna unit was determined for the liquid crystal cell C6 in Example 6 in the same way as in Example 1. The obtained capacitance modulation α was 1.7.

The slot electrode 55B and the patch electrode 15B are required to have at least a predetermined thickness because incoming radio waves need to travel through the electrodes. Furthermore, the slot electrode 55B is required to be discontinuous, because the scanning antenna (liquid crystal antenna) allows the radio waves traveling through the slot board 201B to be cut at the slot electrode 55B for generation of an electrical field, which is one of the principles of the scanning antenna. As in this example, when the thickness of the conductive alignment films OM16 and OM26 is very small (about 100 nm), radio wave cutoff at the slot electrode 55B and radio wave leakage at the patch electrode 15B reliably occur, and thus the conductive alignment films OM16 and OM26 disposed over the entire surface of the substrates in this example do not cause a practical issue. The liquid crystal cell C6 of Example 6 having such a configuration simplifies the process of forming the alignment film (coating process), leading to a reduction in the time required for alignment film formation and an improvement in mass productivity (cost reduction).

Example 7

As illustrated in FIG. 10, a liquid crystal cell C7 of Example 7 includes conductive protection films MP1 and MP2 formed of TaN such that the films MP1 and MP2 cover a patch electrode 15C of a TFT board 101C and a slot electrode 55C of a slot board 201C, respectively. The thickness of each of the conductive protection films MP1 and MP2 is in a range of about 1 nm to about 10 nm. A liquid crystal cell of Example 7 was produced in the same way as that of Example 1, except that the conductive protection films MP1 and MP2 were formed on the patch electrode 15C and the slot electrode 55C and the same alignment film solution as that of Example 4 was used as an alignment film solution.

The capacitance modulation a of the antenna unit was determined for the liquid crystal cell C7 in Example 7 in the same way as in Example 1. The obtained capacitance modulation a was 1.7.

Copper (Cu) that forms the patch electrode 15C and the slot electrode 55C is diffusive and corrosive. To obtain a highly reliable liquid crystal cell for a liquid crystal antenna, formation of a protection film that covers the electrode is one option for prevention of diffusion of the electrode metal and prevention of reaction between the electrode metal and a member in contact with the electrode metal. If an insulating film such as a SiN film or a SiO film is used as the protection film, the variability of electrical capacitance due to liquid crystal response is lowered by the same reason as in Comparative Example 1 including the insulating alignment film. Thus, in this example, the protection films (conductive protection films MP1 and MP2) formed of a conductive material (metal) are disposed on the patch electrode 15C and the slot electrode 55C.

The invention claimed is:
1. A liquid crystal cell including a plurality of antenna units, the liquid crystal cell comprising:
 a TFT board including a first dielectric substrate, a plurality of TFTs on the first dielectric substrate, and a plurality of patch electrodes electrically connected to the plurality of TFTs;
 a slot board including a second dielectric substrate and a slot electrode having a plurality of slots on the second dielectric substrate;
 a conductive alignment film having conductivity on at least one of the plurality of patch electrodes and the slot electrode; and
 a liquid crystal layer disposed between the TFT board and the slot board with the plurality of patch electrodes and the slot electrode facing each other, the liquid crystal layer including liquid crystal molecules that are horizontally aligned with respect to the TFT board and the slot board while no voltage is being applied across the plurality of patch electrodes and the slot electrode,
 wherein the conductive alignment film is disposed only on at least one of the plurality of patch electrodes and the slot electrode, and is not disposed over an area of the TFT board not including the plurality of patch electrodes and an area of the slot board not including the slot electrode.

2. The liquid crystal cell according to claim 1, wherein the conductive alignment film has a surface resistance of less than $1 \times 10^7 \Omega/\square$.

3. The liquid crystal cell according to claim 1, wherein the conductive alignment film includes a conductive polymer.

4. The liquid crystal cell according to claim 3, wherein the conductive polymer is a polythiophene conductive polymer.

5. The liquid crystal cell according to claim 1, wherein the conductive alignment film includes a resin component and a conductive filler.

6. The liquid crystal cell according to claim 5, wherein the conductive filler is contained in an amount of 1% by mass or more.

7. The liquid crystal cell according to claim 5, wherein the conductive filler is at least one selected from the group consisting of carbon black, a carbon nanotube, a silver particle, and a silver nanowire.

8. The liquid crystal cell according to claim 5, wherein the resin component includes at least one of polyimide and polyamic acid.

9. The liquid crystal cell according to claim 1, wherein the conductive alignment film is an aligned conductive film subjected to an alignment treatment.

10. The liquid crystal cell according to claim 1, wherein the liquid crystal molecules have at least one functional group selected from the group consisting of a halogen group, an SCN group, an NCS group, a CN group, an OCN group, an NCO group, a $CF_3$ group, an $OCF_3$ group, and an $SF_5$ group.

11. The liquid crystal cell according to claim 1, wherein the liquid crystal molecules have at least one bond selected from the group consisting of carbon-carbon triple bond (acetylene bond), —CH=CH—, —CF=CF—, —CF=CH—, —CH=CF—, —(CO)O—, —C(CO)—, —CO—, and —O—.

12. The liquid crystal cell according to claim 1, further comprising a conductive protection film covering the plurality of patch electrodes and the slot electrode, wherein
the conductive alignment film is disposed on at least one of the plurality of patch electrodes and the slot electrode with the conductive protection film therebetween.

13. A scanning antenna comprising:
the liquid crystal cell according to claim 1; and
a reflective conductive plate facing a surface of the second dielectric substrate away from the liquid crystal layer with a dielectric layer therebetween.

* * * * *